United States Patent
Sakane et al.

(10) Patent No.: US 6,865,006 B2
(45) Date of Patent: Mar. 8, 2005

(54) OPTICAL MODULATOR MODULE

(75) Inventors: Toshio Sakane, Tokyo (JP); Tsutomu Saitou, Tokyo (JP); Susumu Murata, Tokyo (JP)

(73) Assignee: Sumitomo Osaka Cement Co., Ltd., Tokyo (JP)

( * ) Notice: Subject to any disclaimer, the term of this patent is extended or adjusted under 35 U.S.C. 154(b) by 0 days.

(21) Appl. No.: 10/404,564

(22) Filed: Apr. 1, 2003

(65) Prior Publication Data

US 2004/0047021 A1 Mar. 11, 2004

(30) Foreign Application Priority Data

Apr. 5, 2002 (JP) ........................................ 2002-103242

(51) Int. Cl.[7] .............................................. G02F 1/03
(52) U.S. Cl. .............................. 359/251; 385/2; 385/11; 385/14; 372/26; 372/27; 372/34; 372/43
(58) Field of Search ............................ 359/251; 372/26, 372/27, 34, 36, 43; 385/1, 2, 3, 11, 14

(56) References Cited

U.S. PATENT DOCUMENTS 5,566,264 A * 10/1996 Kuke et al. ................... 385/49
6,721,511 B1 * 4/2004 Tatsuno et al. ............. 398/141

* cited by examiner

*Primary Examiner*—Hung Xuan Dang
*Assistant Examiner*—Tuyen Tra
(74) *Attorney, Agent, or Firm*—Chapman and Cutler LLP (57) ABSTRACT

"This invention offer optical modulator module with fulfilling the effective and the stable optical modulation, which stabilizes the emission of semiconductor and control the shift of optic axis between the optical component by the temperature change and so on, when using the semiconductor laser. Peculiarly, the optical modulator module includes, in same package, the semiconductor laser (27) as light source, the optical modulation device (28) that has optical waveguide on the surface of the chip made by the element of the electro-optical effect, and the polarization rotating element (40) between said semiconductor laser and said optical modulation device, for bringing plane of polarization of light from said semiconductor laser (27) to optimum plane of polarization in waveguide of the said optical modulation device in line and blocking the returning light from said optical modulation device to said semiconductor laser."

9 Claims, 4 Drawing Sheets

OPTICAL MODULATOR MODULE

BACKGROUND OF THE INVENTION (1) Field of the Invention

The present invention relates to an optical modulator module that includes light source and optical modulation device in the same package, and particularly to an optical modulator module that has the semiconductor laser as a light source.

(2) Related Art Statement

In the field of advanced optical communication, the distributed feed back semiconductor laser (DFB laser) that have stable wavelength with narrow spectrum width are commonly used as light source and generates continuous wave (CW) and the laser beam is modulated responding transmission data by the optical modulator, which is placed in external side of the semiconductor laser and the modulated light is sent by the transmission line such as optical fiber.

Moreover, the optical modulator, in most cases has the light guides on the surface of the chip made of the material of electro-optical effect, such as $LiNbO_3$ (LN hereinafter), and electrodes near the light guides that high-speed modulate light guided in said light guides.

In such device, that produces the modulated radiation, it is general to construct the device by mutually connecting individual parts as semiconductor laser and optical modulator etc., and optical components as lens and optical fiber etc. However, according to the recently speed-up and high-capacity of data transmission for wavelength multiplex of optical networking and so on, the construction of device is becoming huge and complex and so it is increasingly needed to integrate and minimize the main components.

Furthermore, when adopting semiconductor laser as a light source, in order to stabilize the oscillation of laser beam the control of the temperature of semiconductor laser and the removal of harmful returning light to the semiconductor laser are required.

In addition, the output laser from semiconductor laser has a plane of polarization. On the other hand, for the effectively modulating operation in external modulator such as LN optical modulator, the light transiting within the modulator is needed to setup to the optimum plane of polarization in optical modulators waveguides. Therefore, it is necessary to adjust the conformity of both planes of polarization.

In case that semiconductor laser and optical modulation device as external modulator, which are main components in the transmitting sides, are integrated into the same package, the following problems need to be solved in addition to the above ones.

First of all, sometimes, the main polarized direction of the polarization plane of output laser of semiconductor laser is different from optimum polarized direction of incident light, which forms the optimum plane of polarization in LN optical modulator's waveguides. Therefore, spinning function of polarization is necessary for adjusting both of them.

Secondly, in order to control the temperature of semiconductor laser, the temperature-controlling tool such as Peltier device is mounted inside the supporting member of semiconductor laser. The effect of temperature change from said temperature-controlling tool and semiconductor laser spread to whole supporting member and cause the dimensional change of itself. Therefore, the shift of light axis will cause between the optical component, as semiconductor laser, supported by said supporting member and optical modulation device and so on set outside of the said supporting member. As a result, the increase of coupling loss, or the change of the coupling loss will occur, which disables to modulate light effectively and stably.

Moreover, waveguide mode of LN optical modulation device is small in mode diameter and it is generally asymmetric. Therefore, tolerance of alignment is very small; particularly there is a problem that the tolerance of alignment, which is vertical to the surface of package and so supporting the LN optical modulation device, is much smaller.

For this reason, when two devices, which are placed in different supporting members, are optically integrated by interval optical system, it is necessary to compose the optical integrate system, which can be placed precisely to each element and even if size change of each supporting member occurred, it has to be stable without sift of optic axis.

The objects of the present inventions are to solve the above stated problems and minimize whole device, especially offer optical modulator module with fulfilling the effective and the stable optical modulation, which stabilizes the emission of semiconductor and control the shift of optic axis between the optical component by the temperature change and so on, when using the semiconductor laser.

SUMMARY OF THE INVENTION

In order to achieve the said objects, the invention related to claim 1 has following features. The optical modulator module includes, in same package, the semiconductor laser as light source, the optical modulation device that has optical waveguide on the surface of the chip made of the material with the electro-optical effect, and the polarization rotating element between said semiconductor laser and said optical modulation device, for bringing plane of polarization of light from said semiconductor laser to optimum plane of polarization in waveguide of the said optical modulation device in line and blocking the returning light from said optical modulation device to said semiconductor laser.

In accordance with the invention related to claim 1, same polarization rotating element can achieve to bring the plane of polarization of light from semiconductor laser to optimum plane of polarization in waveguide of the optical modulation device, and block the returning light from optical modulation device to semiconductor laser as function named "isolator". Therefore, it will prevent the increase of device size and moreover, even when the plane of polarization of light from semiconductor laser and expected optimum plane of polarization of the incident ray to the optical modulation device differs, it can prevent the loss caused by the optical joint between semiconductor laser and light modulation device, because it is possible to bring together by the said polarization rotating element.

The invention related to claim 2 has following features.

The optical modulator module as claimed in claim 1, includes said polarization rotating element that allocates, from the side of semiconductor laser, first polarizer that transmit the main polarization component of semiconductor laser, first faraday element that rotates 45° of transmitting light against the transmission axial of said first polarizer, second polarizer with the transmission axial that transmits the output polarization of said first faraday element, second faraday element that rotates 45° of said second polarizer transmitting light in same direction of first faraday element, and means that gives the magnetic field to said first and second faraday elements on optical axis in same direction.

In accordance, with the invention related to claim 2, it can prevent the loss cased by the optical joint between semiconductor laser and optical modulation device, even when the polarization axis of main polarization component of semiconductor laser and the optimum direction of polarization of incident ray in optical modulation device (this stands for the direction of polarization of the most preferable incident ray in order to modulate incident optical modulation device to modulate in the most effective way) is different by 90°.

In addition, the invention related to claim 3 has following features.

The optical modulator module as claimed in claim 1, includes said polarization rotating element that allocates, from the side of semiconductor laser, first polarizer that transmit the main polarization component of semiconductor laser, first faraday element that rotates 45° of transmitting light against the transmission axial of said first polarizer, second polarizer with the transmission axial that transmits the output polarization of said first faraday element, second faraday element that rotates 45° of said second polarizer transmitting light in same direction of first faraday element, third polarizer with the transmission axial that transmits the output polarization of said second faraday element, and means that gives the magnetic field to said first and second faraday element on optical axis in same direction.

In accordance with the invention related to claim 3, even if the polarization axis of main polarization component of semiconductor laser and the optimum direction of polarization of incident ray in optical modulation device is different by 90°, it can prevent the loss caused by the optical joint between semiconductor laser and optical modulation device, and moreover, block the returning light that returns from light modulation device to semiconductor laser.

In addition, the invention related to claim 4 has following features.

The optical modulator module as claimed in claim 1, includes said polarization rotating element that allocates, from the side of semiconductor laser, first polarizer that transmit the main polarization component of semiconductor laser, first faraday element that rotates 45° of transmitting light against the transmission axial of said first polarizer, second polarizer with the transmission axial that transmits the output polarization of said first faraday element, second faraday element that rotate 45° of said second polarizer transmitting light in opposite direction of first faraday element, and means that gives each magnetic field to first and second faraday elements, on optical axis in mutually opposite direction.

In accordance with the invention related to claim 4, even if the polarization axis of main polarization component of semiconductor laser is almost identical with optimum direction of polarization of incident ray in optical modulation device, it can prevent the loss caused by the optical joint between semiconductor laser and optical modulation device.

In addition, the invention related to claim 5 has following features.

The optical modulator module as claimed in claim 1, includes said polarization rotating element that allocates, from the side of semiconductor laser, first polarizer that transmit the main polarization component of semiconductor laser, first faraday element that rotates 45° of transmitting light against the transmission axial of said first polarizer, second polarizer with the transmission axial that transmits the output polarization of said first faraday element, second faraday element that rotate 45° of said second polarizer transmitting light in opposite direction of first faraday element, third polarizer with transmission axial that transmits the output polarization of said second faraday element, and means that gives each magnetic field to first and second faraday element on optical axis in mutually opposite direction.

In accordance with the invention of claim 5, even if the polarization axis of main polarization component of semiconductor laser is almost identical with optimum direction of polarization of incident ray in optical modulation device, it can prevent the loss caused by the optical joint between semiconductor laser and optical modulation device, and moreover, block the returning light that returns from optical modulation device to semiconductor laser.

In addition, the invention related to claim 6 is characterized by the optical modulator module as claimed in claim 1 to 5, that includes a permanent magnet or electromagnet that can adjust the intensity of magnet field, as means that gives the magnetic field to the said first or second faraday element.

In accordance with the invention related to claim 6, when using the permanent magnet, it simplifies the structure of device and when using the electromagnet, as compared to the permanent magnet, it will realize the more suitable rotation of polarization. Also, it will more effectively prevent the loss caused by the optical joint between semiconductor laser and optical modulation device, and block to the returning light that returns from optical modulation device to semiconductor laser.

In addition, the invention related to claim 7 has following features. The optical modulator module that includes, in same package, the semiconductor laser as light source and the optical modulation device that has optical waveguide on the surface of the chip made of the material, with the electro-optical effect, comprises supporting member for light source which supports said semiconductor laser, photo detector monitoring for semiconductor laser, beam forming optical element, isolator, and optical convergence elements, and optional fiber that is fixed to said supporting member on one edge of it and on the another edge against the input port of said optical modulation device that is placed externally to the said supporting member.

In accordance with the invention related to claim 7, even if the size and position of the supporting member for light source which supports optical components, containing semiconductor laser, is changed by environment variation, aging and various effect, it will make possible to incident the light with appropriate convergence condition at all times to optical modulation device by optical fiber that is fixed as stated above.

In addition, the invention related to claim 8 has following features. The optical modulator module as claimed in claim 7, includes said fiber optics that is polarization maintaining fiber, which directs the stress addition axis of said polarization maintaining fiber fixed in the side of the optical modulation device, to the optimum direction of polarization of incident ray in said optical modulation device, and directs the stress addition axis of said polarization maintaining fiber fixed in the side of supporting member for light source, to the direction of main polarization of output light from said optical convergence element.

In accordance with the invention related to claim 8, even if the size and position of the supporting member for light source which supports optical components, containing semiconductor laser, is changed by environment variation, aging, and various effect, it will make possible to incident the light with suitable plane of polarization and appropriate convergence condition at all times to the optical modulation device by polarization maintaining fiber that is fixed as stated above.

In addition, the invention related to claim 9 has following feature. The optical modulator module as claimed in claim 7 and 8, includes said supporting member for light source that contains the temperature control means for said semiconductor laser.

In accordance with the invention related to claim 9, it will make possible not only to fulfill the stable laser emission with keeping the given temperature of semiconductor laser, but also incident the light with suitable plane of polarization or appropriate convergence condition at all times to optical modulation device, even if the temperature variation by temperature control means for semiconductor laser affects the supporting member for light source.

A short description of codes is;
1, 9 LN chip,
2, 10 optical wave guide,
4, 5, 12, 13 electrode,
7, 15 electric field,
19, 27 semiconductor laser,
28 optical modulation device,
30 base of package,
40 isolator,
50 polarization maintaining fiber,
57, 59 faraday element,
56, 58, 60, 72 polarizer,
61, 62, 80, 81 direction of magnetic field.

DETAILED DESCRIPTION OF THE INVENTION

Hereinafter is the detailed description, using the suitable examples of the invention.

In order to comprise the optical modulator chip, the materials that contain electro-optical effect are preferable. For example, lithium niobate ($LiNbO_3$: LN hereinafter), lithium tantaliate ($LiTaO_3$), PLZT (lead lanthanum zirconate titanate), quartz system, and especially, $LiNbO_3$ crystal, $LiTaO_3$ crystal, or solid solution crystal structured by Lid and $LiTaO_3$ are preferable, because they are easy to be made for light guide device and their anisotropy is bigger. In this practical example, the example mainly using lithium niobate (LN) is going to be explained.

In order to product optical modulator, Ti thermal diffusion above the LN chip constructs the light guide, and there are ways to construct electrode directly above the LN chip without placing the buffer layer on the whole chip or in some part, and another way to construct electrode for reducing the propagation loss of light inside the light wave guide indirectly by the placing buffer layer made of dielectric such as $SiO_2$ above LN chip, and then structuring earth electrode and signal electrode, which is several tens $\mu$m high by making electrode pattern of Ti, Au on the layer, and plating gold and so.

Also, it is possible to make multilayer structure by placing membrane such as SiN and Si above the buffer layer.

In general, optical modulator is comprised severally in one LN wafer and completed by separating optical modulator to individual chip.

Then, the characteristic structures of this invention are going to be explained.

LN optical modulation device has the structures that would use input polarization and electric field of modulation in the biggest coefficient of electro-optical effect, r33, in order to increase the modulation efficiency.

Figure 1:
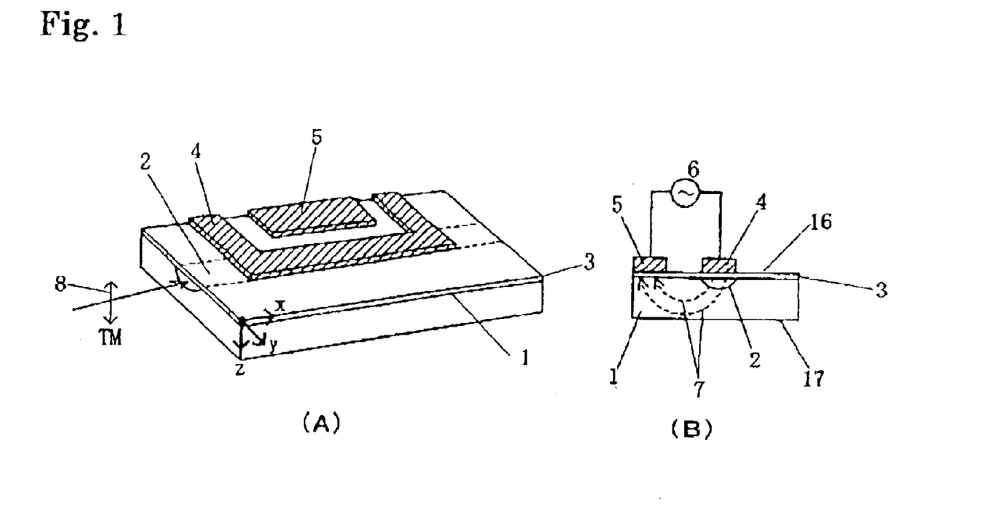
FIG. 1 is an overhead view (FIG. 1A) and a cross section (FIG. 1B) of Z-CUT type of optical modulation device.
Figure 2:
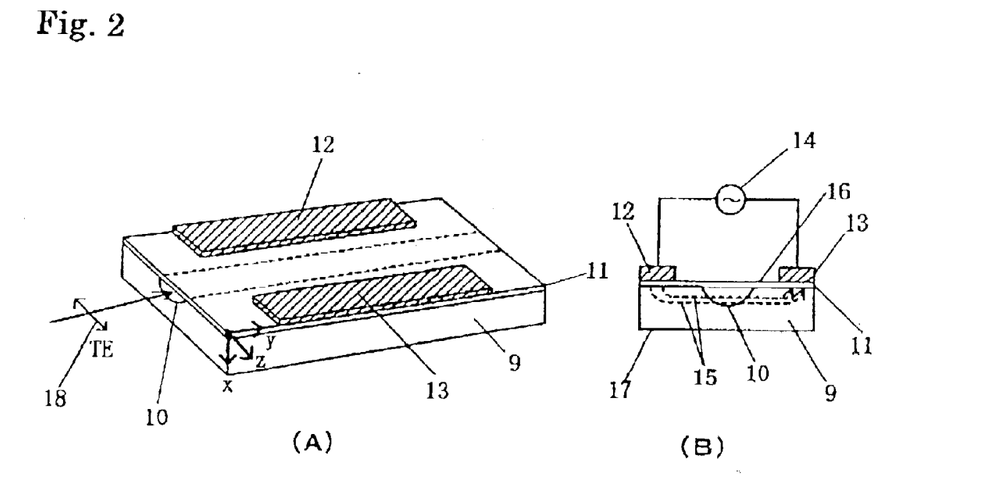
FIG. 2 is an overhead view (FIG. 1A) and a cross section (FIG. 1B) of X-CUT type of optical modulation device.

FIG. 1 is the drawing of LN optical modulation device, which has the board those directions of crystal axis in most efficient change of the refractive index, by the electro-optical effect, is vertical direction to the surface of the chip (Z-CUT type board). FIG. 2 is the drawing of LN optical modulation device, which has the chip those directions of crystal axis in most efficient change of the refractive index by the electro-optical effect is parallel direction to the surface of the chip and vertical direction to the light transmitting direction (X-CUT type board).

In FIG. 1 (FIG. 1A is an overhead view and FIG. 1B is a cross section of Z-CUT type of light modulation device), 1 is Z-CUT type chip, and on the surface of the chip there is optical wave guide 2 made by internal diffusing the elements such as Ti, and on that surface there is buffer layer 3 of $SiO_2$. Also, in order to give the electric field directing Z in the optical wave guide 2, there is a pair of electrode 4, 5.

If electrode pole 4, 5 is impressed by modulation voltage 6, modulation electric field 7 occurs and the component of electric field in optical wave guide 2 by said modulation electric field 7 will be same as Z component. When guiding the TM wave 8 that has the direction to Z polarization towards said light guide 2, and the vertical polarization component to the surface 16 of optical modulation device, and the most efficient interaction will be generated in which the refractive index of light, namely phase of light will be changed proportionally to electric field.

In addition, FIG. 2 (FIG. 2A is an over head view and FIG. 2B is a cross section of X-CUT type optical modulation device) shows that, 9 is X-CUT type board and on the surface of the chip there is optional wave guide 10 made by internal diffusing the elements such as Ti, and on that surface there is buffer layer 11 of $SiO_2$. Also, it will make a pair of electrode 12, 13 near the optical wave guide like sandwiching optical wave guide 10.

If electrode 12, 13 are impressed by modulation voltage 14, modulation electric field 15 occurs and the component of electric field in optical wave guide 10 of said modulation electric field 15 will direct Z, which is written in FIG. 2A. When inputting the TM wave 18, that has the polarization component (the parallel polarization component to the surface of optical modulation device) that directs the same direction as Z, to said optical wave guide 10, the most efficient interaction will be generated in which the refractive index of light, namely phase of light will be changed proportionally to electric field.

The mode diameter of optical wave guide in optical modulation device is about 8 $\mu$m in the parallel direction to the surface of optical wave guide, and is about 6 µm in the vertical direction to the surface of optical wave guide.

On the other hand, for light source, which is used for optical networking, distributed feedback (DFB) laser or distributed reflection (DBR) laser, which has stable wavelength and narrow spectrum, is used. Both are wave guiding type laser and as described in FIG. 3, barrier layer 20 with ridge structure placed in chip 19 will be the optical wave guide directing longitudinal, and will output from output plane 21 a single frequency light, amplified by shuttling between the mirrors made by grating that is unillustrated or the mirrors made by grating and reflecting coating, inside the said optical wave guide.

Figure 3:
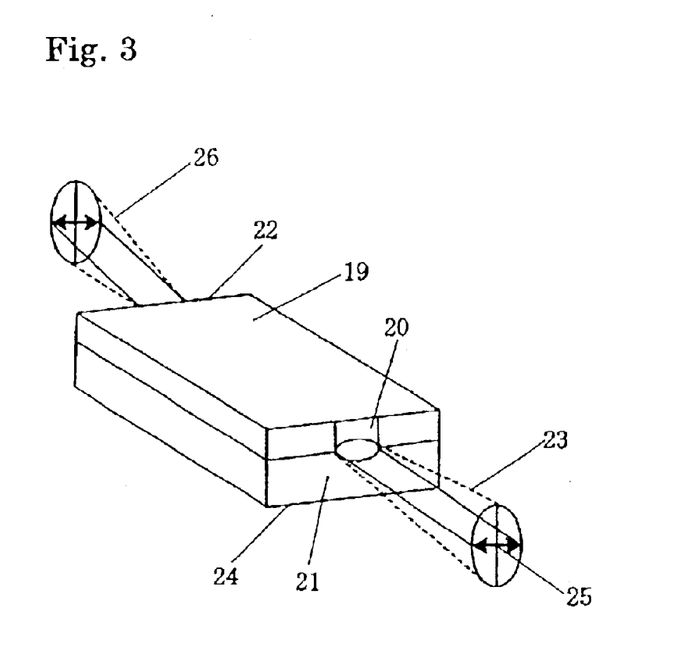
FIG. 3 is a schematic diagram of semiconductor laser.

On the other hand, light 26 that has same frequency will output from back plane 22, but this will be used for a monitor in general, which observes the intensity of output light of semiconductor laser.

Output light 23 is elliptic polarization, which has axis mainly with the polarization direction 25, parallel to the chip's bottom face 24, and has more than 20 dB polarization ratio. In addition, size of light beam is about 1 µm in the vertical direction towards the bottom face 24 and about 2 µm in the parallel direction towards the bottom face and the divergence angle in vertical direction is larger and, in far field, it will be the elliptic shaped beam with bigger vertical diameter towards the bottom face 24.

In addition, if there is returning light from external reflector, semiconductor laser presumes the reflector as external resonance mirror and so phenomenon of fluctuation in oscillatory frequency and emission intensity will occur. Therefore, prevention of these returning lights is necessary.

Generally, semiconductor laser module prevents the returning light to the laser by tilting the surface of optics such as lens or coating antireflective coat to the surface such as lens. Moreover, in order to prevent semiconductor laser combining with returning light from external module, it has isolator built in.

Figure 4:
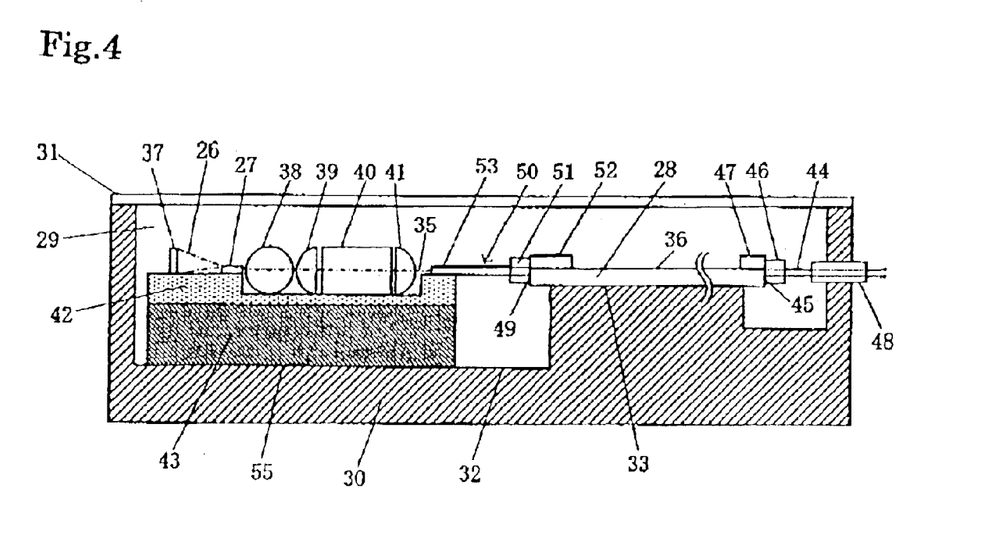
FIG. 4 is a cross section of optical modulator module of the present invention.

FIG. 4 describes the cross section of optical, modulator module as an example of present inventions that includes semiconductor laser 27, and LN optical modulation device 28 in same package 29.

At this moment, package is formed by base 30 and cover 31. On the internal bottom face 32 of base 30 semiconductor laser module is bonded and on another internal bottom face 33, which is parallel to the said internal bottom 32, LN optical modulation device is adhered.

In order that the height of optical axis 35 of output light of semiconductor laser 27 and wave guide axis 36 of LN modulation device 28 may become in almost same height, internal bottom face 32, 33 will be adjusted in height.

Laser module contains, semiconductor laser 27, photodiode 37 that receives the light of back emission 26, beam forming cylindrical lens 38 for modifying the unequal divergence angles of output light 23 to same ones in length and breadth, lens 39 with focus length f1 for transforming divergent beam to collimated beam, isolator 40, and lens 41 with focus length f2 for light focus. These elements are fixed on upper board 42 by bonding or welding.

Said upper board 42 will be fixed on the thermo-cooler 43 with Peltier element for controlling the temperature of upper board stably and stabilizing output wave length of semiconductor laser 27.

In addition, photodiode 37 is formed by bisection of light receiving element or single one. The former will monitor the output light amount and the wavelength drift at the same time. The detecting signal outputted from photodiode 37 is used in the case such as controlling the drive voltage of semiconductor laser, as well known in this technical field.

Upper board 24, which holds a set of optical components for above stated light source including semiconductor laser 27, and thermo-cooler are described as "supporting member for light source". Especially, when the thermo-cooler is not placed, upper board 42 will only be the "supporting member for light source".

The light outputted from semiconductor laser 27, with almost reshaped circular section by lens 38, will be collimated beam by lens 39 and will incident to isolator 40.

The collimated beam outputted from isolator 40 will be focused by lens 41 and will incident to optical wave guide 36 of LN optical modulation device 28 through optical fiber 50 with holding the plane of polarization (polarization maintaining fiber).

Furthermore, the light, modulated in transmission inside the optical wave guide 36, will output from outputting optical fiber 44, which is connected to the edge 45 of LN optical modulation device with butt connection.

Here, 46 is capillary and 47 is stiffened element, and they will reinforce the connecting strength between optical fiber 44 and LN optical modulation device 28. Also, outputting optical fiber 44 is fixed to base 30 by shielding by member 48.

Also in plane of input edge 49 of LN optical modulation device 28, polarization maintaining fiber 50 will be connected with said plane of input edge 49 by butt connection by using capillary 51 and stiffened element 52 and will combine with light wave guide 36.

The direction of stress addition of polarization maintaining fiber 50 (slow direction) is in optimum guide direction of LN light modulation device (TM wave direction in Z-CUT type light modulation device, TM wave direction in X-CUT type light modulation device).

The other edge 53 of polarization maintaining fiber 50 will place the groove to upper board 42, which have stabilized the temperature of laser module, and will be fixed to the said groove by bonding or welding.

In the practical example of FIG. 4, the length of polarization maintaining fiber is about 10 mm. The direction of stress addition of the incident edge of polarization maintaining fiber 50 is in same direction with the direction of stress addition of output edge of polarization maintaining fiber 50 in edge plane 49 side of LN optical modulation device, against the internal bottom face 32 of base 30.

Therefore, polarization maintaining fiber 50 is fixed without being twisted.

In addition, for another example, even if the optimum direction of incident polarization of optical modulation device and polarization axis of main polarization component in semiconductor laser differs, by using the polarization maintaining fiber that has enough length to omit extra stress to the polarization maintaining fiber itself and fixing both edge of the said polarization maintaining fiber as making the directions of stress addition in incident side and outgoing side of said polarization maintaining fibers different by the given angle (for example, 90°), plane of polarization can be rotated by given angle when the light is transmitted in the polarization maintaining fiber and it is possible to place plane of polarization in same direction as optimum direction of incident polarization of optical modulation device when the light out goes from the polarization maintaining fiber.

In case of optical connection between semiconductor laser 27 and LN optical modulation device 28 by using polarization maintaining fiber 50, the ratio f1/f2 of focus length f1 of lens 39 and focus length f2 of lens 41 should be almost ½~⅓ in order to fit the mode diameter 10 µm of polarization maintaining fiber.

Figure 5:
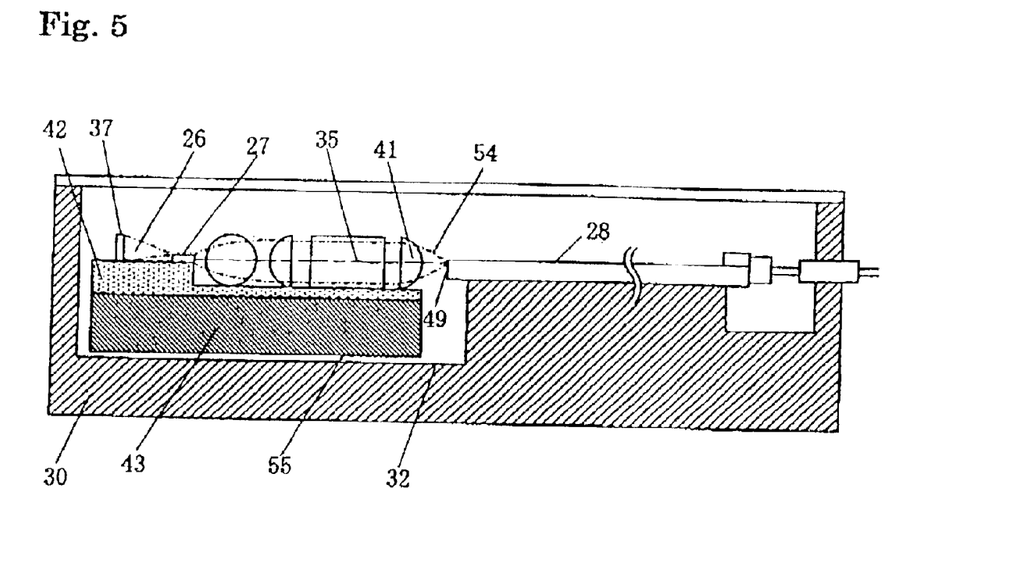
FIG. 5 is a cross section of optical modulator module that does not use the polarization maintaining fiber.

Using the above stated polarization maintaining fiber, it is possible to remove the weakness in case of using lens connection, which will focus directly to the face of edge 49 of LN optical modulation device from convergent beam 54 coming from lens 41, as it is drawn in FIG. 5.

Precisely, the temperature of board 42 will be stable by thermo-cooler 43, however, the difference of temperature of the base 30 side and upper board 42 side of thermo-cooler 43 is great and because its element is semiconductor and ceramic, the linear expansion coefficient is great. In consequence, it is difficult to stabilize the location of optical axis 35, which is against internal bottom face 32 of base 30, regardless of the change of environment and aging such as temperature.

On the other hand, it is necessary to control less than 1 µm alignment tolerance because the optical coupling to optical wave guide 36 of LN optical modulation device 28 has small tolerance, especially in direction of altitude, is very small. For this reason, in order to maintain the stable optical coupling, as same as LN optical modulation device, upper board 42 must be fixed against base 30, however in this case, to mitigate the mechanical distortion by thermal expansion of supporting member for light source (upper board 42, thermo-cooler 43) it is necessary to float the radiating surface 55 of thermo-cooler 43 against internal bottom face 32 of base 30. However, in this structure, heat radiation effect will not increase and the capability of semiconductor laser will be limited.

As the practical explanation of FIG. 4, if the optical modulation part (optical modulation device) and light source part (the place where will be supported by upper board 42) are connected by polarization maintaining fiber 50, the relative deviation between both sides will be absorbed by polarization maintaining fiber 50 and it will make possible to maintain the stable optical coupling even in change of environment and aging.

Next, for the other feature of this invention, polarization-rotating element, which has the isolator system, will be explained by using FIGS. 6, 7.

As FIG. 4 describes, the direction of polarization of outgoing light from semiconductor laser 27 is parallel to internal bottom face 32 of base 30.

On the other hand, in Z-CUT type optical modulation device, the optimum incident polarization is TM wave and directs vertically to the internal bottom face 33 of base 30.

In order to coincide on the direction of both polarization, function element that rotates polarization by 90° between semiconductor laser 27 and LN optical modulation device 28 is needed.

Figure 6:
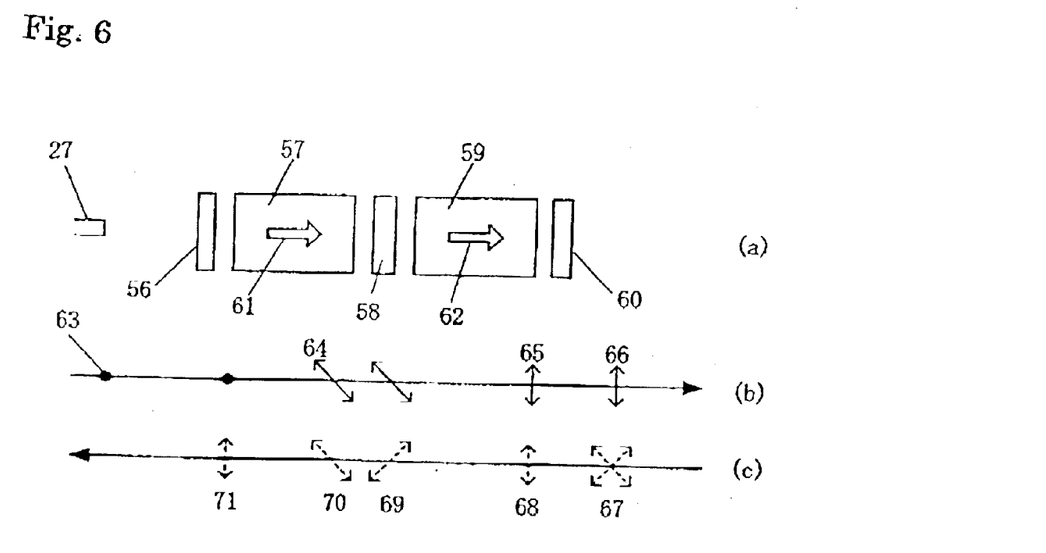
FIG. 6 is a drawing that explains the isolator that has a system to rotate the polarized wave (90° rotation).

FIG. 6 is one of the examples, and as FIG. 6A describes, from the semiconductor laser 27 side, it is composed with first polarizer 56, first 45° faraday element 57, second polarizer 58, second 45° faraday element 59, and third polarizer 60.

It will impress the direct saturated magnetic field directing optic axis on first and second faraday element 57, 59 by magnet such as $SmCO_5$ which is not described.

The transmission axial of polarizer 56 should be horizontal (parallel to internal bottom face 32). The transmission axial of polarizer 58 is the axis for transmitting the polarization that is rotated by faraday element 57. The transmission axial of polarizer 60 should be vertical (vertical to internal bottom face 32).

From these structures, as FIG. 6B, the polarized wave 63, which is parallel to internal bottom face 32 from semiconductor laser 27, will be rotated for 45° (64) by first faraday element 57, and will be rotated again for 45° (65) by second faraday element 59 and will become polarized wave 66 that is vertical to internal bottom face 32.

In this setup, as described with dotted arrow in FIG. 6C, the returning light (68) with only vertical component can be transmit to the third polarizer, inside the non-polarized returning light 67 from LN optical modulation device side, and will be back propagated through the second faraday element 59. Back propagation light receives 45° rotation in same direction by the non-reciprocity of faraday element and becomes polarized wave rotated 90° from transmission axial of the second polarizer. From this, returning light to semiconductor laser 28 will be blocked.

Even if the polarization 69 became slightly nonlinear by crystallinity of faraday element or dependency of wave length, and even if leaking lights 70 comes out from the second polarizer, it will be blocked by first faraday element 57 and first polarizer 56, and the returning light, which will incident on semiconductor laser 27, will decrease drastically.

Faraday element 57 and 59 is ferromagnetic material such as $Y_3Fe_5O_{12}$ (YIG).

The elimination of third polarizer 60 declines the isolation effect but it is possible to abbreviate it in order to decline the number of optical components.

From this formation, the necessary rotation polarization and isolator system can be fulfilled at the same time.

Figure 7:
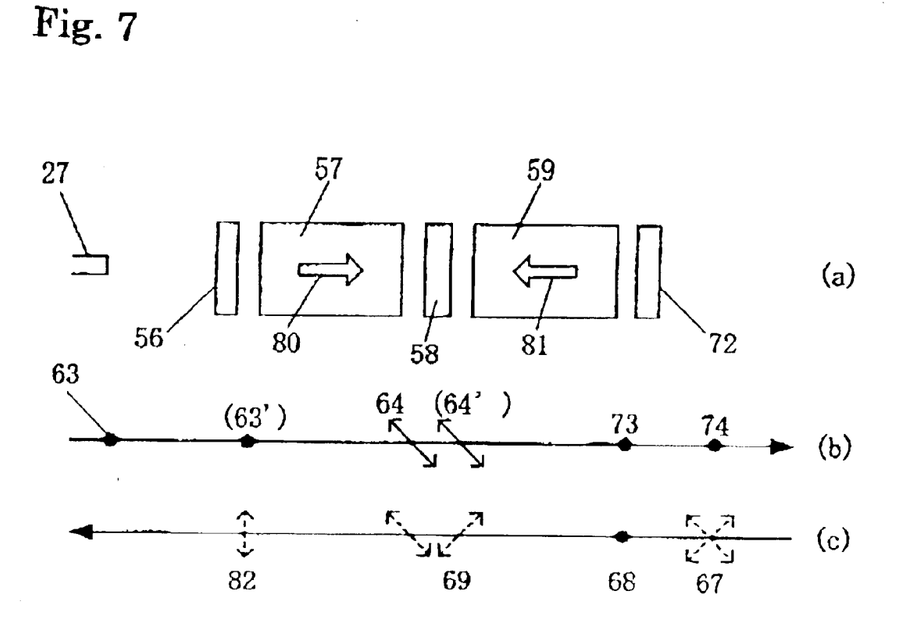
FIG. 7 is a drawing that explains the isolator that has a system to rotate the polarized wave (0° rotation).

Further, from FIG. 7, example of optical system with X-CUT type optical modulation device is going to be explained.

The optimum incident polarization of LN optical modulation element 28 is parallel to internal bottom face 33 of base 30 and directs same way as the direction of main polarization of semiconductor laser 28.

In this case, faraday element and polarizer are same as FIG. 6. However, it will reverse the magnetic field 81 that is impressed on second faraday element 59 against magnetic field 80 on first faraday element 57.

In addition, transmission axial of third polarizer 72 must be parallel to internal bottom face 32. However, it is possible to eliminate third polarizer, likewise the above-mentioned case of Z-CUT type optical modulation device.

In the case of FIG. 7, 45° polarization (64') that is transmitted through second polarizer 58 receives the reverse rotation by second faraday element, and the output polarization 73 returns horizontal and will be transmitted (74) through the third polarizer 72.

On the other hand, returning light 67 from LN optical modulation device side will be blocked to incident on semiconductor laser 27 as aforesaid by polarizer and non-reciprocity of above said faraday element.

Magnetic field 80 and 81 are supplied by the independent magnets such as $SmCO_5$.

In addition, polarizer 56, 58, 60, 72 are polarizers like "LAMIPOL" or "POLARCOR", which is about 30 µm in thickness.

For the way to impress the magnetic field on faraday element, not only the above mentioned way by using permanence magnet, but also it can be magnetic field strengths changeable one, such as electromagnet. In this case, it would be able to get optimum modulation status with controlling the said magnetic fields strengths by monitoring the output light from the optical modulation device.

The examples of explanation used LN optical phase modulation device as a optical modulation device. However, it is clear that this invention would be adaptable to the ferroelectric modulation device, except for LN one optical strength modulation device except for optical phase modulation device, or even passive device such as PLC, against various optical wave guide element that has polarization dependency.

In addition, about connecting structure and connector that is related to electronic signals input and output of optical modulator module, it is clear that various technology known in this technical field is adaptable to this invention, unless it inhibits this inventions feature.

In consequence from this invention, it is possible to minimize the whole optical modulator module because of controlling additional components by utilizing the optical components such as prior isolator, especially when using semiconductor laser for light source, by temperature control and controlling returning light, it is possible to stabilize the emission of semiconductor laser.

In addition, it is possible to control the creep of optical axis between optical components by the obstacles such as temperature change. Then it realizes the optical modulator module, which can make the effective and stable light modulation, with hardly affected by the change of environment and aging.

What is claimed is:

1. An optical modulator module including, in same package, a semiconductor laser as light source, an optical modulation device having optical waveguide on a surface of a chip made of material with electro-optical effect, and a polarization rotating element between said semiconductor laser and said optical modulation device, for bringing plane of polarization of light from said semiconductor laser to optimum plane of polarization in waveguide of said optical modulation device in line and blocking returning light from said optical modulation device to said semiconductor laser, including said polarization rotating element that allocates, from a side of said semiconductor laser, first polarizer that transmits a main polarization component of semiconductor laser, first faraday element that rotates 45° of transmitting light against the transmission axial of said first polarizer, second polarizer with the transmission axial that transmits the output polarization of said first faraday element, second faraday element that rotates 45° of said second polarizer transmitting light in same direction of first faraday element, and means that gives the magnetic field to said first and second faraday elements on optical axis in same direction.

2. An optical modulator module including, in same package, a semiconductor laser as light source, an optical modulation device having optical waveguide on a surface of a chip made of material with electro-optical effect, and a polarization rotating element between said semiconductor laser and said optical modulation device, for bringing plane of polarization of light from said semiconductor laser to optimum plane of polarization in waveguide of said optical modulation device in line and blocking returning light from said optical modulation device to said semiconductor laser, including said polarization rotating element that allocates, from a side of said semiconductor laser, first polarizer that transmits a main polarization component of semiconductor laser, first faraday element that rotates 45° of transmitting light against the transmission axial of said first polarizer, second polarizer with the transmission axial that transmits the output polarization of said first faraday element, second faraday clement that rotates 45° of said second polarizer transmitting light in same direction of said first faraday element, third polarizer with the transmission axial that transmits the output polarization of said second faraday element, and means that gives the magnetic field to said first and second faraday elements on optical axis in same direction.

3. An optical modulator module including, in same package, a semiconductor laser as light source, an optical modulation device having optical waveguide on a surface of a chip made of material with electro-optical effect, and a polarization rotating element between said semiconductor laser and said optical modulation device, for bringing plane of polarization of light from said semiconductor laser to optimum plane of polarization in waveguide of said optical modulation device in line and blocking returning light from said optical modulation device to said semiconductor laser, including said polarization rotating element that allocates, from a side of said semiconductor laser, first polarizer that transmits a main polarization component of semiconductor laser, first faraday element that rotates 45° of transmitting light against the transmission axial of said first polarizer, second polarizer with the transmission axial that transmits the output polarization of said first faraday element, second faraday element that rotates 45° of said second polarizer transmitting light in opposite direction of said first faraday element, and means that gives each magnetic field to said first and second faraday elements, on optical axis mutually opposite direction.

4. An optical modulator module including, in same package, a semiconductor laser as light source, an optical modulation device having optical waveguide on a surface of a chip made of material with electro-optical effect, and a polarization rotating element between said semiconductor laser and said optical modulation device, for bringing plane of polarization of light from said semiconductor laser to optimum plane of polarization in waveguide of said optical modulation device in line and blocking returning light from said optical modulation device to said semiconductor laser, including said polarization rotating element that allocates, from a side of said semiconductor laser, first polarizer that transmits a main polarization component of semiconductor laser, first faraday element that rotates 45° of transmitting light against the transmission axial of said first polarizer, second polarizer with the transmission axial that transmits the output polarization of said first faraday element, second faraday element that rotates 45° of said second polarizer transmitting light in opposite direction of said first faraday element, third polarizer with transmission axial that transmits the output polarization of said second faraday element, and means that gives each magnetic field to said first and second faraday element on optical axis in mutually opposite direction.

5. The optical modulator module as claimed in any one of claims 1 to 4, including a permanent magnet or electromagnet that can adjust the intensity of magnet field, as means that gives the magnetic field to said first faraday element or said second faraday element.

6. An optical modulator module including, in same package, a semiconductor laser as light source and an optical modulation device that has optical waveguide on a surface of a chip made of material with electro-optical effect, comprising a supporting member for light source which supports said semiconductor laser, photo detector monitoring for semiconductor laser, beam forming optical element, isolator, and optical convergence elements, and optical fiber, one edge of said optical fiber being fixed to said supporting member, and a second edge of said optical fiber being fixed against an input port of said optical modulation device placed externally to the said supporting member.

7. The optical modulator module as claimed in claim 6, wherein said optical fiber is polarization maintaining fiber, which directs the stress addition axis of said polarization maintaining fiber fixed against said input port of the optical modulation device, to the optimum direction of polarization of incident ray in said optical modulation device, and directs the stress addition axis of said polarization maintaining fiber fixed to said supporting member for light source, to the direction of main polarization of output light from said optical convergence element.

8. The optical modulator module as claimed in claim 7, wherein said supporting member for light source contains temperature control means for said semiconductor laser.

9. The optical modulator module as claimed in claim 6, wherein said supporting member for light source contains temperature control means for said semiconductor laser.

* * * * *